United States Patent
Shin et al.

(10) Patent No.: US 12,016,210 B2
(45) Date of Patent: Jun. 18, 2024

(54) ORGANIC LIGHT EMITTING DISPLAY DEVICE AND METHOD OF MANUFACTURING THE SAME

(71) Applicant: Samsung Display Co., Ltd., Yongin-Si (KR)

(72) Inventors: Kyoungju Shin, Hwaseong-si (KR); Seohee Ha, Cheonan-si (KR); Jahyun Im, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/705,107

(22) Filed: Mar. 25, 2022

(65) Prior Publication Data
US 2022/0216282 A1    Jul. 7, 2022

Related U.S. Application Data

(62) Division of application No. 16/727,798, filed on Dec. 26, 2019, now Pat. No. 11,315,994.

(30) Foreign Application Priority Data

Jan. 17, 2019    (KR) .................. 10-2019-0006110

(51) Int. Cl.
*H10K 59/122* (2023.01)
*H10K 50/15* (2023.01)
(Continued)

(52) U.S. Cl.
CPC .......... *H10K 59/124* (2023.02); *H10K 50/15* (2023.02); *H10K 50/16* (2023.02); *H10K 50/17* (2023.02);
(Continued)

(58) Field of Classification Search
CPC ............ H01L 27/1259; H01L 27/1288; H01L 27/3202; H01L 27/3246; H01L 27/326;
(Continued)

(56) References Cited

U.S. PATENT DOCUMENTS 7,868,542 B2 *  1/2011  Fukuda ................ H10K 59/122
                                               313/506
8,525,404 B2 *  9/2013  Jeon ........................ H10K 50/86
                                               313/506
(Continued)

FOREIGN PATENT DOCUMENTS

JP           6242121 B2    12/2017
KR      10-0683695 B1     2/2007
(Continued)

OTHER PUBLICATIONS

Korean Notice of Allowance corresponding to Application No. 10-2019-0006110 and issued on Apr. 8, 2024, 7 pages.

*Primary Examiner* — Eduardo A Rodela
(74) *Attorney, Agent, or Firm* — Innovation Counsel LLP

(57) ABSTRACT

An OLED device may include the following elements: a common electrode; a first pixel electrode overlapping the common electrode; a first emission layer positioned between the first pixel electrode and the common electrode; a second pixel electrode; a second emission layer positioned between the second pixel electrode and the common electrode; and a pixel defining layer including a first opening, a second opening, a first flat face, and an uneven surface structure, wherein the first opening partially exposes the first pixel electrode, wherein the second opening partially exposes the second pixel electrode, wherein the first flat face may be opposite the uneven surface and may be positioned between the first pixel electrode to the second electrode, and wherein (Continued)

the uneven surface may be positioned between the first opening and the second opening.

4 Claims, 11 Drawing Sheets

(51) Int. Cl.
    *H10K 50/16*      (2023.01)
    *H10K 50/17*      (2023.01)
    *H10K 59/124*      (2023.01)
    *H10K 59/35*      (2023.01)
    *H10K 59/84*      (2023.01)
    *H10K 59/88*      (2023.01)
    *H10K 71/00*      (2023.01)
    *H10K 59/12*      (2023.01)
    *H10K 59/121*      (2023.01)

(52) U.S. Cl.
    CPC ......... *H10K 59/122* (2023.02); *H10K 59/353* (2023.02); *H10K 59/84* (2023.02); *H10K 59/88* (2023.02); *H10K 71/00* (2023.02); *H10K 59/1201* (2023.02); *H10K 59/121* (2023.02); *H10K 59/352* (2023.02)

(58) Field of Classification Search
    CPC ... H01L 27/3283; H01L 33/58; H10K 59/122; H10K 59/173; H10K 59/877; H10K 59/878; H10K 59/879
    See application file for complete search history.

(56) References Cited

U.S. PATENT DOCUMENTS

| | | | |
|---|---|---|---|
| 9,343,514 B2 * | 5/2016 | Kim | H01L 27/3246 |
| 9,614,015 B2 * | 4/2017 | Park | G03F 7/0002 |
| 10,319,951 B2 * | 6/2019 | Lee | H01L 51/56 |
| 10,325,970 B2 * | 6/2019 | Bang | H01L 51/0011 |
| 10,770,523 B2 * | 9/2020 | Kim | H01L 51/56 |
| 10,886,345 B2 | 1/2021 | Sun et al. | |
| 10,916,607 B2 * | 2/2021 | Cho | H01L 51/5265 |
| 11,316,126 B2 * | 4/2022 | Liu | H01L 27/3246 |
| 11,335,747 B2 * | 5/2022 | Kim | H01L 27/3283 |
| 2008/0303419 A1 * | 12/2008 | Fukuda | H10K 59/122 313/506 |
| 2013/0187163 A1 * | 7/2013 | Kim | H01L 27/3258 438/34 |
| 2014/0145158 A1 * | 5/2014 | Choi | H01L 27/3262 438/34 |
| 2015/0069361 A1 | 3/2015 | Sato et al. | |
| 2015/0102292 A1 | 4/2015 | Kim | |
| 2016/0141544 A1 | 5/2016 | You | |
| 2016/0248035 A1 | 8/2016 | Hwang et al. | |
| 2016/0268350 A1 * | 9/2016 | Paek | H01L 51/56 |
| 2018/0159076 A1 | 6/2018 | Yun et al. | |
| 2018/0197929 A1 | 7/2018 | Cho et al. | |
| 2019/0013364 A1 | 1/2019 | Yokota | |
| 2020/0091261 A1 | 3/2020 | Kim | |

FOREIGN PATENT DOCUMENTS

| | | |
|---|---|---|
| KR | 10-2007-0065681 A | 6/2007 |
| KR | 10-2015-0005264 A | 1/2015 |
| KR | 10-2015-0043142 A | 4/2015 |
| KR | 10-2015-0044290 A | 4/2015 |
| KR | 10-2015-0067624 A | 6/2015 |
| KR | 10-2015-0089435 A | 8/2015 |
| KR | 10-2016-0059047 A | 5/2016 |
| KR | 10-2016-0066650 A | 6/2016 |
| KR | 10-2016-0104161 A | 9/2016 |
| KR | 10-2018-0032249 A | 3/2018 |
| KR | 10-1900954 B1 | 9/2018 |

* cited by examiner

ORGANIC LIGHT EMITTING DISPLAY DEVICE AND METHOD OF MANUFACTURING THE SAME

CROSS-REFERENCE TO RELATED APPLICATIONS

This application is a divisional application of U.S. patent application Ser. No. 16/727,798 filed on Dec. 26, 2019, which claims priority under 35 USC § 119 to Korean Patent Application No. 10-2019-0006110 filed on Jan. 17, 2019 in the Korean Intellectual Property Office (KIPO); the prior applications are incorporated by reference.

BACKGROUND

1. Field

The technical field relates to an organic light emitting display device and a method of manufacturing an organic light emitting display device.

2. Description of the Related Art

Organic light emitting display (OLED) devices are self-luminous display devices that use organic light emitting diodes to emit light to display images. An OLED device does not require a separate light source; thus, the thickness and weight of the OLED device can be minimized.

An OLED device may include a plurality of pixels. If electric charges undesirably flow from one pixel (of a certain color) into another pixel (of another color) during operation of the OLED device, the quality of images displayed by the OLED device may be unsatisfactory.

SUMMARY

Embodiments may be related to an organic light emitting display (OLED) device in which lateral leakage current between pixels may be minimized.

Embodiments may be related to a method of manufacturing the OLED device.

An OLED device according to embodiments may include the following elements: a substrate including a first pixel area, a second pixel area, a third pixel area, and a peripheral area surrounding the first to third pixel areas; a first pixel electrode, a second pixel electrode, and a third pixel electrode disposed on the substrate, the first pixel electrode, the second pixel electrode, and the third pixel electrode respectively overlapping the first pixel area, the second pixel area, and the third pixel area; a pixel defining layer disposed on the substrate, the pixel defining layer overlapping the peripheral area and having an upper surface at which an uneven structure is formed between the first pixel area and the second pixel area; a hole injection layer disposed on the first to third pixel electrodes and the pixel defining layer, the hole injection layer being formed along a profile of the upper surface of the pixel defining layer; a first emission layer, a second emission layer, and a third emission layer disposed on the hole injection layer, the first emission layer, the second emission layer, and the third emission layer respectively overlapping the first pixel area, the second pixel area, and the third pixel area; and a common electrode disposed on the first to third emission layers and the hole injection layer.

In an embodiment, the uneven structure may be formed only between the first pixel area and the second pixel area.

In an embodiment, the upper surface of the pixel defining layer between the first pixel area and the third pixel area may be flat.

In an embodiment, a distance between the first pixel area and the second pixel area may be less than a distance between the first pixel area and the third pixel area.

In an embodiment, the uneven structure may be further formed at the upper surface of the pixel defining layer between the first pixel area and the third pixel area.

In an embodiment, a portion of the upper surface of the pixel defining layer at which the uneven structure is not formed may be flat.

In an embodiment, the second pixel area may be located in a first direction from the first pixel area, and the uneven structure may include concave portions and convex portions alternatively arranged along the first direction.

In an embodiment, each of the concave portions may extend in a second direction perpendicular to the first direction and parallel to the substrate.

In an embodiment, lengths of the concave portions may be uniform.

In an embodiment, lengths of the concave portions may increase as being away from the first pixel area or the second pixel area.

In an embodiment, the OLED device may further include a spacer disposed between the pixel defining layer and the hole injection layer, the spacer overlapping the peripheral area and not overlapping the uneven structure.

In an embodiment, the first emission layer, the second emission layer, and the third emission layer may respectively emit a red light, a green light, and a blue light.

In an embodiment, the OLED device may further include a hole transport layer disposed between the hole injection layer and the first to third emission layers, the hole transport layer being formed along a profile of the upper surface of the pixel defining layer.

In an embodiment, the OLED device may further include an electron transport layer disposed between the first to third emission layers and the common electrode, the electron transport layer being formed along a profile of the upper surface of the pixel defining layer.

An OLED device according to embodiments may include the following elements: a plurality of pixels each including a pixel electrode, a hole injection layer, an emission layer, and a common electrode which are sequentially stacked; and a pixel defining layer dividing the plurality of pixels, the pixel defining layer having an upper surface at which an uneven structure is formed between the plurality of pixels. The hole injection layer may be formed commonly over the plurality of pixels and along a profile of the upper surface of the pixel defining layer.

In an embodiment, a portion of the upper surface of the pixel defining layer at which the uneven structure is not formed may be flat.

In an embodiment, the uneven structure may include concave portions and convex portions alternatively arranged between the plurality of pixels.

A method of manufacturing an OLED device according to embodiments may include the following steps: forming a first pixel electrode, a second pixel electrode, and a third pixel electrode on the substrate, the first pixel electrode, the second pixel electrode, and the third pixel electrode respectively overlapping the first pixel area, the second pixel area, and the third pixel area; forming a pixel defining layer on the substrate, the pixel defining layer overlapping a peripheral area surrounding the first to third pixel areas and having an upper surface at which an uneven structure is formed between the first pixel area and the second pixel area; forming a hole injection layer on the first to third pixel electrodes and the pixel defining layer, the hole injection layer being formed along a profile of the upper surface of the pixel defining layer; forming a first emission layer, a second emission layer, and a third emission layer on the hole injection layer, the first emission layer, the second emission layer, and the third emission layer respectively overlapping the first pixel area, the second pixel area, and the third pixel area; and forming a common electrode on the first to third emission layers and the hole injection layer.

In an embodiment, the second pixel area may be located in a first direction from the first pixel area, and the uneven structure may include concave portions and convex portions alternatively arranged along the first direction.

In an embodiment, forming the pixel defining layer may include forming a preliminary pixel defining layer on the substrate on which the first to third pixel electrodes are formed, providing a halftone mask over the preliminary pixel defining layer, and exposing and developing the preliminary pixel defining layer using the halftone mask.

In an embodiment, the halftone mask may include light transmitting portions, light shielding portions, and semi-light transmitting portions. The light transmitting portions may correspond to opening portions of the pixel defining layer respectively exposing the first to third pixel electrodes, the light shielding portions may correspond to the convex portions of the uneven structure, and the semi-light transmitting portions may correspond to the concave portions of the uneven structure.

An embodiment may be related to an organic light emitting display (OLED) device. The OLED device may include the following elements: a substrate; a first pixel electrode, a second pixel electrode, and a third pixel electrode each overlapping the substrate; a pixel defining layer including a first opening, a second opening, and a third opening respectively partially exposing the first pixel electrode, the second pixel electrode, and the third pixel electrode, wherein the pixel defining layer may include a first uneven surface and a first flat face, wherein the first uneven surface may be opposite the first flat face and may be positioned between the first opening and the second opening, and wherein the first flat face may be positioned between the first pixel electrode and the second pixel electrode and may be positioned between the first uneven surface and the substrate; a first emission layer, a second emission layer, and a third emission layer respectively corresponding to the first opening, the second opening, and the third opening; and a common electrode overlapping each of the first emission layer, the second emission layer, and the third emission layer.

The first uneven surface may be only positioned between the first emission layer and the second emission layer.

The first uneven surface may be positioned between two opposite parallel faces of the first emission layer.

A surface of the pixel defining layer may be positioned not farther from the common electrode than any other surfaces of the pixel defining layer, may be positioned between the first opening and the third opening, and may be flat.

A minimum distance between the first emission layer and the second emission layer may be less than a minimum distance between the first emission layer and the third emission layer.

The pixel defining layer may include a second uneven surface and a second flat face. The second uneven surface may be positioned between the first opening and the third opening and may be opposite the second flat face. The second flat face may be positioned between the first pixel electrode and the third pixel electrode and may be positioned between the second uneven surface and the substrate.

A surface of the pixel defining layer may be positioned not farther from the common electrode than any other surfaces of the pixel defining layer, may be positioned between the second opening and the third opening, and may be flat.

The first uneven surface may include cavities and protrusions alternatively arranged between the first opening and the second opening.

A lengthwise direction of each of the cavities may be parallel to an edge of the first opening and may be parallel to the substrate.

Lengths of the cavities may be equal.

The cavities include a first cavity and a second cavity. The first cavity may be positioned closer to the first opening than the second cavity and may be shorter than the second cavity.

The OLED device may include the following elements: a hole injection layer directly contacting each of the first pixel electrode, the second pixel electrode, the third pixel electrode, and the pixel defining layer; and a spacer disposed between the pixel defining layer and the hole injection layer and directly contacting a second flat face of the pixel defining layer. The hole injection layer may include cavities. The cavities may be positioned between the first opening and the second opening. The second flat face of the pixel defining layer may extend from an edge of the second opening to an edge of the third opening and may be spaced from the first uneven surface.

The first emission layer, the second emission layer, and the third emission layer may be respectively configured to emit a red light, a green light, and a blue light. The first emission layer and the second emission layer may immediately neighbor each other with no intervening emission layer between the first emission layer and the second emission layer.

The OLED device may include the following elements: a hole injection layer directly contacting each of the first pixel electrode, the second pixel electrode, the third pixel electrode, and the pixel defining layer; and a hole transport layer disposed between the hole injection layer and each of the first emission layer, the second emission layer, and the third emission layer. The hole transport layer may overlap the pixel defining layer and may include cavities. The cavities may be positioned between the first opening and the second opening.

The OLED device may include an electron transport layer disposed between the common electrode and each of the first emission layer, the second emission layer, and the third emission layer, the electron transport layer overlapping the pixel defining layer.

An embodiment may be related to an OLED device. The OLED device may include the following elements: a common electrode; a first pixel electrode overlapping the common electrode; a first emission layer positioned between the first pixel electrode and the common electrode; a second pixel electrode; a second emission layer positioned between the second pixel electrode and the common electrode; and a pixel defining layer including a first opening, a second opening, a first flat face, and an uneven surface structure, wherein the first opening partially exposes the first pixel electrode, wherein the second opening partially exposes the second pixel electrode, wherein the first flat face may be opposite the uneven surface, may be positioned between the first pixel electrode and the second pixel electrode, and may extend from the first pixel electrode to the second pixel electrode, and wherein the uneven surface may be positioned between the first opening and the second opening.

The OLED device may include the following elements: a third pixel electrode; and a third emission layer positioned between the third pixel electrode and the common electrode. The pixel defining layer may include a third opening, a second flat face, and a third flat face. The third opening may partially expose the third pixel electrode. The second flat face may be opposite the third flat face, may be positioned between the second pixel electrode and the third pixel electrode, and may extend from the second pixel electrode to the third pixel electrode. The third flat face may be positioned between the second opening and the third opening and may extend from the second opening to the third opening.

The uneven surface may include cavities and protrusions alternatively arranged between the first opening and the second opening.

An embodiment may be related to a method of manufacturing an OLED device. The method may include the following steps: forming a first pixel electrode, a second pixel electrode, and a third pixel electrode on a substrate; forming a pixel defining layer on the substrate, wherein the pixel defining layer may include a first opening, a second opening, and a third opening respectively partially exposing the first pixel electrode, the second pixel electrode, and the third pixel electrode, wherein the pixel defining layer may include an uneven surface and a first flat face, wherein the uneven surface may be opposite the first flat face and may be positioned between the first opening and the second opening, and wherein the first flat face may be positioned between the first pixel electrode and the second pixel electrode and may be positioned between the uneven surface and the substrate; forming a first emission layer, a second emission layer, and a third emission layer that respectively correspond to the first opening, the second opening, and the third opening; and forming a common electrode that overlaps each of the first emission layer, the second emission layer, and the third emission layer.

The uneven surface may include cavities and protrusions alternatively arranged between the first opening and the second opening.

Forming the pixel defining layer may include the following steps: forming a material layer on the substrate, the first pixel electrode, the second pixel electrode, and the third pixel electrode; providing a halftone mask over the material layer; and exposing and developing the material layer using the halftone mask.

The halftone mask may include light transmitting portions, light shielding portions, and semi-light transmitting portions. The light transmitting portions may correspond to the first opening, the second opening, and the third opening. The light shielding portions may correspond to the protrusions of the uneven surface structure. The semi-light transmitting portions may correspond to the cavities of the uneven surface structure.

An OLED device according to an embodiment may include a pixel defining layer having an upper surface with an uneven structure between pixels, and a hole injection layer may be formed on the pixel defining layer. Accordingly, an electrical path of the hole injection layer between the pixels may lengthen, and lateral leakage current between the pixels through the hole injection layer may decrease.

In a method of manufacturing the OLED device according to an embodiments, the pixel defining layer may be formed using a halftone mask so that the pixel defining layer having opening portions and an uneven upper surface may be formed by single photolithography process. Therefore, manufacturing time and/or cost of the OLED device may be minimized.

DETAILED DESCRIPTION

Example embodiments are explained with reference to the accompanying drawings.

Although the terms "first," "second," etc. may be used to describe various elements, these elements, should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

Figure 1:
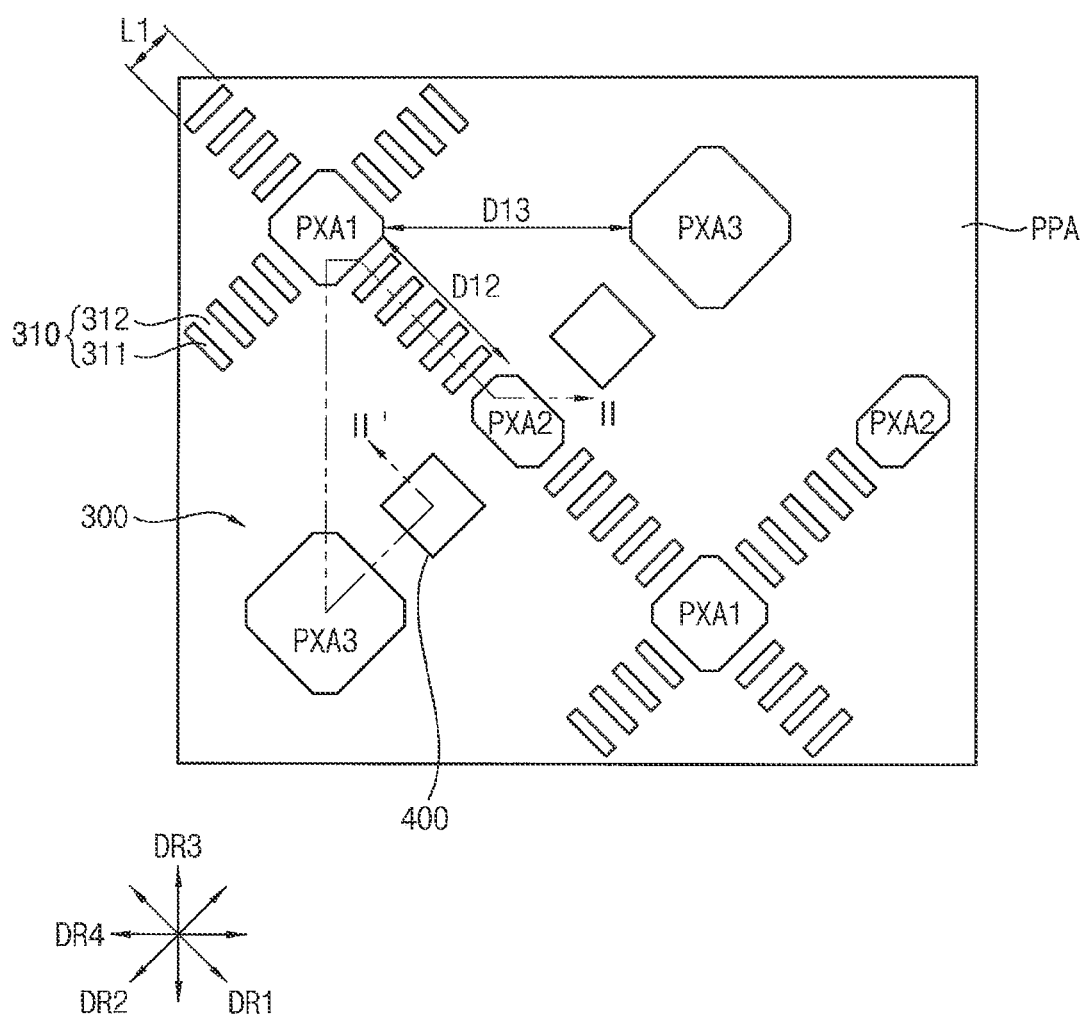
FIG. 1 is a plan view illustrating an organic light emitting display (OLED) device according to an embodiment.
Figure 2:
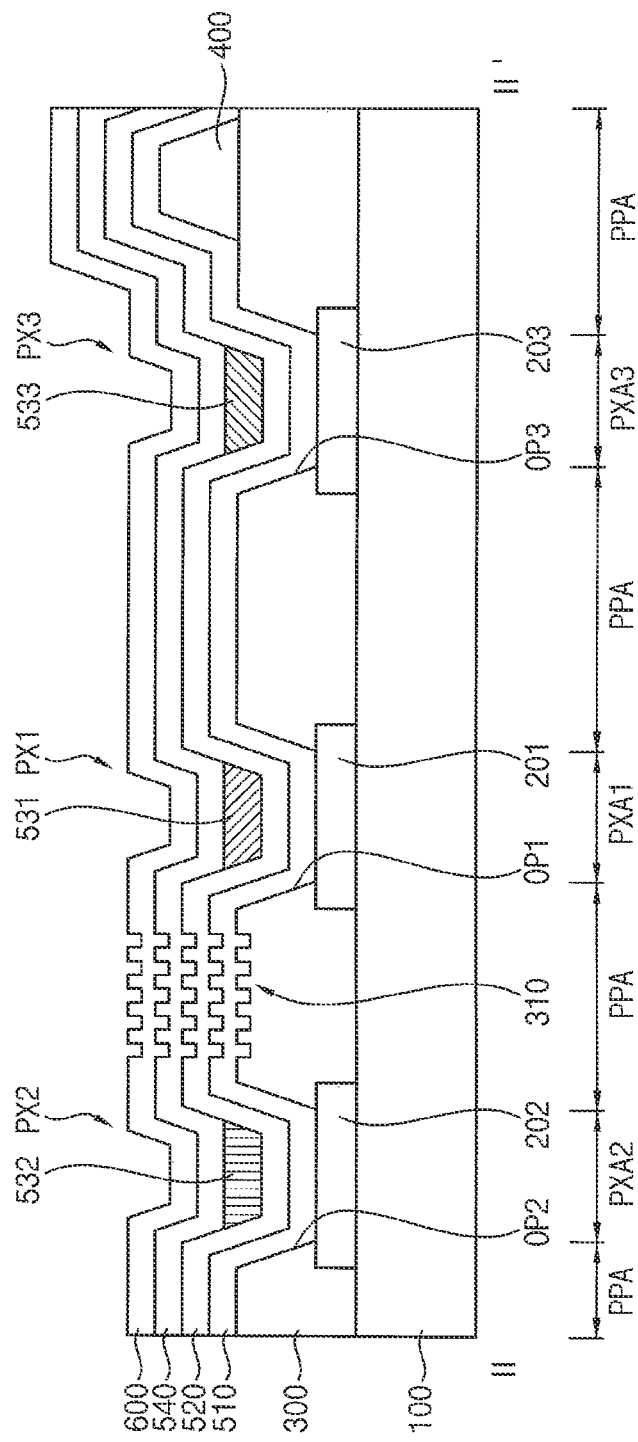
FIG. 2 is a cross-sectional view taken along a line II-II' in FIG. 1 according to an embodiment.
Figure 3:
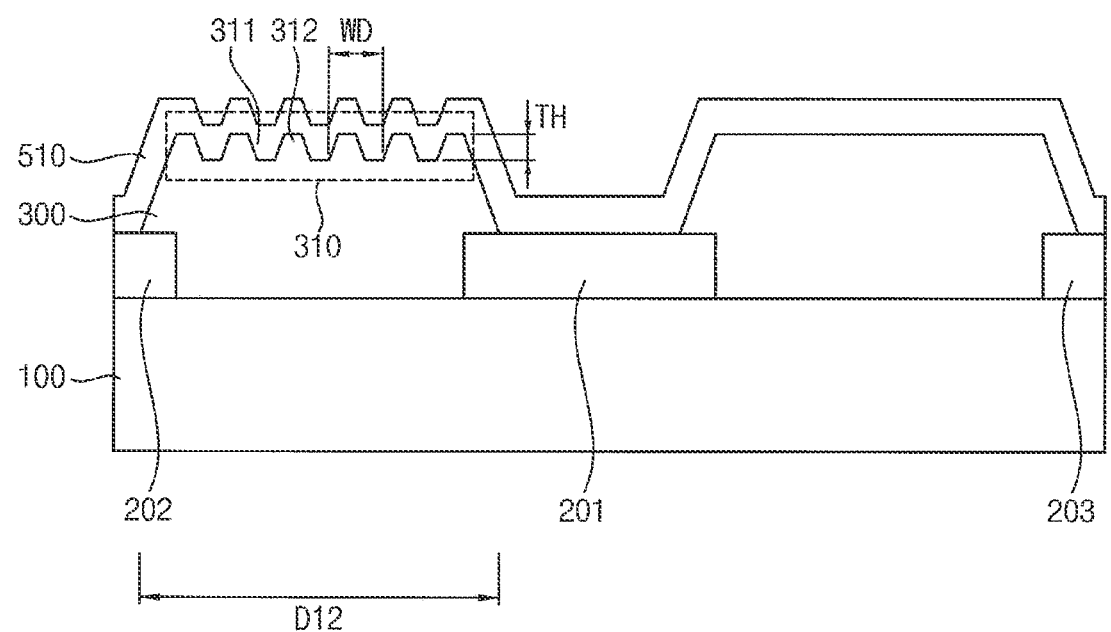
FIG. 3 is a cross-sectional view illustrating a pixel defining layer and a hole injection layer in FIG. 2 according to an embodiment.

FIG. 1 is a plan view illustrating an OLED according to an embodiment. FIG. 2 is a cross-sectional view taken along a line II-II' in FIG. 1 according to an embodiment. FIG. 3 is a cross-sectional view illustrating a pixel defining layer and a hole injection layer in FIG. 2 according to an embodiment.

Referring to FIGS. 1, 2, and 3, the OLED device may include a substrate 100, a plurality of pixel electrodes 201, 202, and 203, a pixel defining layer 300; a spacer 400, a hole injection layer 510, a hole transport layer 520, a plurality of emission layers 531, 532, and 533; an electron transport layer 540, and a common electrode 600. The OLED device may include a plurality of pixels PX1, PX2, and PX3 defined by the plurality of pixel electrodes 201, 202, and 203, the hole injection layer 510, the hole transport layer 520, the plurality of emission layers 531, 532, and 533, the electron transport layer 540, and the common electrode 600. Boundaries of the pixels and/or boundaries of pixel areas associated with the pixels may correspond to edges of openings of the pixel defining layer 300.

The substrate 100 may be substantially formed of transparent glass containing $SiO_x$. The substrate 100 may be formed of a plastic material. Although not shown in the figures, the substrate 100 may include at least one thin film transistor and/or a capacitor for driving each pixel; a circuit for driving the pixel may use the thin film transistor, the capacitor, and the like.

The substrate 100 may include a plurality of pixel areas PXA1, PXA2, and PXA3 and a peripheral area PPA. The pixel areas PXA1, PXA2, and PXA3 may include a plurality of first pixel areas PXA1, a plurality of second pixel areas PXA2, and a plurality of third pixel areas PXA3. A first pixel area PXA1, a second pixel area PXA2, and a third pixel area PXA3 may be spaced apart from each other. For example, when the first pixel area PXA1 is spaced from the second pixel area PXA2 in a first direction DR1, the third pixel area PXA3 may be spaced from the second pixel area PXA2 in a second direction DR2 perpendicular to the first direction DR1. For example, when the first pixel area PXA1 is spaced from the second pixel area PXA2 in the second direction DR2, the third pixel area PXA3 may be spaced from the second pixel area PXA2 in the first direction DR1. Further, the third pixel area PXA3 may be spaced from the first pixel area PXA1 in a third direction DR3 or in a fourth direction DR4 perpendicular to the third direction DR3. For example, the third direction DR3 may be inclined by about 45 degrees in a clockwise direction from the first direction DR1, and the fourth direction DR4 may be inclined by about 45 degrees in a clockwise direction from the second direction DR2. Boundaries of the pixel areas PXA1, PXA2, and PXA3 may respectively correspond to (bottom) boundaries of openings OP1, OP2, and OP3 of the pixel defining layer 300.

In an embodiment, a distance between the first pixel area PXA1 and the second pixel area PXA2 is less than a distance between the first pixel area PXA1 and the third pixel area PXA3. For example, a distance D12 between the first pixel area PXA1 and the second pixel area PXA2 may be about 19.2 µm, and a distance D13 between the first pixel area PXA1 and the third pixel area PXA3 may be about 25.9 µm. The peripheral area PPA may surround the pixel areas PXA1, PXA2, and PXA3.

The pixel electrodes 201, 202, and 203 may be disposed on the substrate 100. The pixel electrodes 201, 202, and 203 may include a first pixel electrode 201, a second pixel electrode 202, and a third pixel electrode 203. The first pixel electrode 201, the second pixel electrode 202, and the third pixel electrode 203 may overlap the first pixel area PXA1, the second pixel area PXA2, and the third pixel area PXA3, respectively. The first to third pixel electrodes 201, 202, and 203 may include at least one of a reflective conductive material, a transparent conductive material, a semi-transparent conductive material, etc.

The pixel defining layer 300 may be disposed on the substrate 100. The pixel defining layer 300 may include a plurality of opening portions OP1, OP2, and OP3 (or openings OP1, OP2, and OP3). The opening portions OP1, OP2, and OP3 may include a first opening portion OP1, a second opening portion OP2, and a third opening portion OP3. The first opening portion OP1, the second opening portion OP2, and the third opening portion OP3 may expose the first pixel electrode 201, the second pixel electrode 202, and the third pixel electrode 203, respectively. For example, the first to third opening portions OP1, OP2, and OP3 may respectively cover edge portions of the first to third pixel electrodes 201, 202, and 203, and may respectively expose central portions of the first to third pixel electrodes 201, 202, and 203. The pixel defining layer 300 may overlap the peripheral area PPA. The opening portions OP1, OP2, and OP3 may define the pixels PX1, PX2, and PX3, respectively. In other words, the pixel defining layer 300 may divide the pixels PX1, PX2, and PX3 from each other. The pixel defining layer 300 may include a photosensitive organic insulation material.

The pixels PX1, PX2, and PX3 may include a first pixel PX1, a second pixel PX2, and a third pixel PX3 emitting different colors of light. In an embodiment, the first pixel PX1, the second pixel PX2, and the third pixel PX3 may be a red pixel emitting red light, a green pixel emitting green light, and a blue pixel emitting blue light, respectively. Each of the pixels PX1, PX2, and PX3 may include one of the pixel electrode 201, 202, and 203, a portion of the hole injection layer 510, a portion of the hole transport layer 520, one of the emission layer 531, 532, and 533, a portion of the electron transport layer 540, and a portion of the common electrode 600.

An uneven structure 310 may be formed at an upper surface of the pixel defining layer 300. The uneven structure 310 may be formed between the pixels PX1, PX2, and PX3. In an embodiment, one or more uneven structures 310 may be formed between the first pixel area PXA1 and other pixel areas PXA2 and PXA3. In other words, one or more uneven structures 310 may be formed between the first pixel area PXA1 and the second pixel area PXA2 and/or between the first pixel area PXA1 and the third pixel area PXA3. In another embodiment, an uneven structure 310 may also be formed between the second pixel area PXA2 and the third pixel area PXA3. An upper surface of the pixel defining layer 300 at which no uneven structure 310 is formed may be substantially flat (or planarized).

In an embodiment, the uneven structure 310 may be formed only between the first pixel area PXA1 and the second pixel area PXA2, and no uneven structure 310 may be formed between the first pixel area PXA1 and the third pixel area PXA3. In such an embodiment, an upper surface of the pixel defining layer 300 between the first pixel area PXA1 and the third pixel area PXA3 may be substantially flat (or planarized).

The uneven structure 310 may include a plurality of concave portions 311 (or cavities 311) and a plurality of convex portions 312 (or protrusions 312). The concave portions 311 may be recessed from the upper surface of the pixel defining layer 300 toward the substrate 100, and the convex portions 312 may protrude toward the common electrode 600. The concave portions 311 and the convex portions 312 may be alternatively arranged along the first direction DR1 or the second direction DR2 in which the second pixel area PXA2 is spaced from the first pixel area PXA1.

The uneven structure 310 may have a predetermined thickness TH. For example, the thickness TH of the uneven structure 310 may be about 1.4 µm. For example, the thickness TH of the uneven structure 310 may correspond to a depth of the concave portion 311 of the uneven structure 310. The uneven structure 310 may include uneven units periodically formed by the concave portions 311 and the convex portions 312 which are alternatively arranged, and the uneven unit may have a predetermined width WD. For example, the width WD of the uneven unit may be about 2.9 µm. For example, the width WD of the uneven unit may correspond to a sum of a width of the concave portion 311 and a width of the convex portion 312. Because the uneven structure 310 is formed at the upper surface of the pixel defining layer 300, an electrical path length of the upper surface of the pixel defining layer 300 which is defined along the concave portions 311 and the convex portions 312 of the uneven structure 310 may increase.

Each of the concave portions 311 may extend along a direction perpendicular to a direction along which the concave portions 311 and the convex portions 312 are alternatively arranged and parallel to the substrate 100. For example, when the concave portions 311 and the convex portions 312 are alternatively arranged along the first direction DR1, each of the concave portions 311 may extend in the second direction DR2 and may extend perpendicular to the nearest edges of the openings of the pixel defining layer 300; the lengthwise directions of the concave portions 311 may be the second direction DR2. Further, when the concave portions 311 and the convex portions 312 are alternatively arranged along the second direction DR2, each of the concave portions 311 may extend in the first direction DR1; the lengthwise directions of the concave portions 311 may be the first direction DR1.

In an embodiment, lengths L1 of the concave portions 311 may be substantially equal to one another. For example, the length L1 of the concave portion 311 may be a length in a lengthwise direction of the concave portion 311. The concave portions 311 may have substantially the same lengths L1.

Spacers 400 may be disposed on the pixel defining layer 300. A spacer 400 may overlap the peripheral area PPA. The spacer 400 may not overlap the uneven structure 310. No spacer 400 may be formed between the first pixel area PXA1 and other pixel areas PXA2 and PXA3. The spacer 400 may support an encapsulation substrate, an encapsulation layer, etc. formed over the pixels PX1, PX2, and PX3, and may separate the encapsulation substrate, the encapsulation layer, etc. from the pixels PX1, PX2, and PX3 to protect the pixels PX1, PX2, and PX3. The spacer 400 may include a photosensitive organic insulation material. In an embodiment, the spacer 400 may include substantially the same material as that of the pixel defining layer 300 and may be significantly wider than each concave portion 311, each convex portion 312, multiple concave portions 311, and/or multiple convex portions 312 in a width direction of each concave portion 311 or each convex portion 312.

The hole injection layer 510 may be disposed on the first to third pixel electrodes 201, 202, and 203, the pixel defining layer 300, and the spacer 400. The hole injection layer 510 may be commonly formed over the first to third pixels PX1, PX2, and PX3. The hole injection layer 510 may be located over an entire upper surface of the substrate 100.

The hole injection layer 510 may serve to improve the injection of holes from each of the pixel electrodes 201, 202, and 203 to the hole transport layer 520. The hole injection layer 510 may include one or more phthalocyanine compounds such as at least one of copper phthalocyanine, polyaniline/dodecylbenzenesulfonic acid (PANI/DBSA), 4,4',4''-tris{N,-(2-naphthyl)-N-phenylamino}-triphenylamine (2TNATA), 4,4',4''-tris(3-methylphenylphenylamino)triphenylamine (m-MTDATA), 4,4'4''-Tris(N,N-diphenylamino)triphenylamine (TDATA), polyaniline/camphor sulfonic acid (PANI/CSA), polyaniline/poly(4-styrenesulfonate) (PANI/PSS), N,N-diphenyl-N,N-bis-[4-(phenyl-m-tolyl-amino)-phenyl]-biphenyl-4,4'-diamine (DNTPD), and poly(3,4-ethylenedioxythiophene)/poly(4-styrenesulfonate) (PEDOT/PSS).

The hole injection layer 510 may be formed along profiles of the first to third pixel electrodes 201, 202, and 203 and the pixel defining layer 300 on the substrate 100. The hole injection layer 510 may be formed along a profile of the upper surface of the pixel defining layer 300. The hole injection layer 510 may be formed along a profile of the uneven structure 310 formed at the upper surface of the pixel defining layer 300 between the first pixel area PXA1 and the second pixel area PXA2. Further, the hole injection layer 510 may be formed along a profile of the substantially flat (or planarized) upper surface of the pixel defining layer 300 between the first pixel area PXA1 and the third pixel area PXA3.

Since the hole injection layer 510 is formed between the first pixel area PXA1 and the second pixel area PXA2 along a profile of the upper surface of the pixel defining layer 300 at which the uneven structure 310 is formed, a length of the hole injection layer 510 between the first pixel area PXA1 and the second pixel area PXA2 may increase. For example, when a horizontal distance D12 between the first pixel area PXA1 and the second pixel area PXA2 is about 19.2 μm, if an upper surface of the pixel defining layer 300 between the first pixel area PXA1 and the second pixel area PXA2 is substantially flat (or planarized) in a comparative example, a length of the hole injection layer 510 between the first pixel area PXA1 and the second pixel area PXA2 may be about 21.5 μm. In an embodiment, the uneven structure 310 is formed at the upper surface of the pixel defining layer 300 between the first pixel area PXA1 and the second pixel area PXA2, such that a length of the hole injection layer 510 between the first pixel area PXA1 and the second pixel area PXA2 may be about 28.0 μm. Therefore, when the uneven structure 310 is formed at the upper surface of the pixel defining layer 300, the length of the hole injection layer 510 may increase by about 1.3 times.

The hole injection layer 510 may be formed of a material having a relatively high charge mobility. When formed as a common layer over the pixels PX1, PX2, and PX3, the hole injection layer 510 may become a path for the movement of electric charges (holes) between the pixels PX1, PX2, and PX3. Accordingly, when one pixel is driven, lateral leakage current may flow through an adjacent pixel via the hole injection layer 510 if the hole injection layer 510 provides a sufficiently short electrical path. The hole injection layer 510 may function as a conductive medium between the adjacent pixels PX1, PX2, and PX3, and an electrical resistance R of the hole injection layer 510 that functions as the conductive medium is illustrated in a mathematical equation below.

$$R = \frac{\rho \cdot L}{W \cdot t}$$ [mathematical equation]

The ρ illustrates a resistivity of the hole injection layer 510, the L illustrates an electrical path length of the hole injection layer 510, the W illustrates an electrical path width of the hole injection layer 510, and the t illustrates an electrical path thickness of the hole injection layer 510.

The first pixel PX1 emitting red light may have a relatively low turn-on voltage. When an electrical path between the first pixel area PXA1 and the second pixel area PXA2 is relatively short, according to driving of the second pixel PX2, the first pixel PX1 may emit light in response to lateral leakage current transmitted from the second pixel PX2 to the first pixel PX1 via the hole injection layer 510, and color-mixing may occur at low luminance According to an embodiment, the hole injection layer 510 may be formed along the upper surface of the pixel defining layer 300 at which the uneven structure 310 is formed between the first pixel area PXA1 and the second pixel area PXA2, so that the electrical path length L of the hole injection layer 510 between the first pixel area PXA1 and the second pixel area PXA2 may increase; therefore, the electrical resistance R of the hole injection layer 510 between the first pixel area PXA1 and the second pixel area PXA2 may increase. Accordingly, the magnitude of the lateral leakage current between the first pixel PX1 and the second pixel PX2 via the hole injection layer 510 may decrease, and color-mixing at low luminance due to the lateral leakage current may be prevented.

The hole transport layer 520 may be disposed on the hole injection layer 510. The hole transport layer 520 may be commonly formed over the first to third pixels PX1, PX2, and PX3. The hole transport layer 520 may be located over an entire upper surface of the substrate 100.

The hole transport layer 520 may serve to smoothly transport holes transmitted from the hole injection layer 510. The hole transport layer 520 may include one or more carbazole-based derivatives such as at least one of N-phenylcarbazole, polyvinylcarbazole, etc., fluorine-based derivatives, triphenylamine-based derivatives such as N,N'-bis(3-methylphenyl)-N,N'-diphenyl-[1,1-biphenyl]-4,4'-diamine (TPD), 4,4',4"-tris(N-carbazolyl)triphenylamine (TCTA), etc., N,N'-di(1-naphthyl)-N,N'-diphenylbenzidine (NPB), and 4,4'-cyclohexylidenebis[N,N-bis(4-methylphenyl)benzenamine] (TAPC). The hole injection layer 510 may include the same material as that included in the hole transport layer 520 and may be doped with a P-type dopant for improving a hole injection characteristic by decreasing a driving voltage of each pixel.

The hole transport layer 520 may be formed along a profile of the hole injection layer 510 disposed on the pixel defining layer 300. The hole transport layer 520 may be formed along a profile of the upper surface of the pixel defining layer 300. The hole transport layer 520 may be formed along a profile of the uneven structure 310 formed at the upper surface of the pixel defining layer 300 between the first pixel area PXA1 and the second pixel area PXA2. Further, the hole transport layer 520 may be formed along a profile of the substantially flat (or planarized) upper surface of the pixel defining layer 300 between the first pixel area PXA1 and the third pixel area PXA3. Since the hole transport layer 520 is formed between the first pixel area PXA1 and the second pixel area PXA2 along a profile of the upper surface of the pixel defining layer 300 at which the uneven structure 310 is formed, a length of the hole transport layer 520 between the first pixel area PXA1 and the second pixel area PXA2 may increase.

The emission layers 531, 532, and 533 may be formed on the hole transport layer 520. The emission layers 531, 532, and 533 may include a first emission layer 531, a second emission layer 532, and a third emission layer 533. The first emission layer 531, the second emission layer 532, and the third emission layer 533 may overlap the first pixel area PXA1, the second pixel area PXA2, and the third pixel area PXA3, respectively. The first to third emission layers 531, 532, and 533 may include a host and a dopant. The first to third emission layers 531, 532, and 533 may include materials respectively emitting red color, green color, and blue color, and may be formed of a phosphorescent material or a fluorescent material.

The first emission layer 531 emitting red light may include a host material that includes CBP (carbazole biphenyl) or mCP (1,3-bis(carbazol-9-yl), and may be formed of a phosphorescent material including a dopant including at least one selected from PIQIr(acac) (bis(1-phenylisoquinoline)acetylacetonate iridium), PQIr(acac) (bis(1-phenylquinoline)acetylacetonate iridium), PQIr(tris(1-phenylquinoline)iridium), and PtOEP (octaethylporphyrin platinum), or may be formed of a fluorescent material including PBD:Eu (DBM)3(Phen) or perylene.

The second emission layer 532 emitting green light may include a host material that includes CBP or mCP, and may be formed of a phosphorescent material that includes a dopant material including Ir(ppy)3(fac-tris(2-phenylpyridine)iridium), or may be formed of a fluorescent material including Alq3(tris(8-hydroxyquinolino)aluminum).

The third emission layer 533 emitting blue light may include a host material including CBP or mCP, and may be formed of a phosphorescent material that includes a dopant material including (4,6-F2ppy)2Irpic, or may be formed of a fluorescent material including at least one selected from a group of spiro-DPVBi, spiro-6P, distyryl benzene (DSB), distyrylarylene (DSA), a PFO-based polymer, and a PPV-based polymer.

The electron transport layer 540 may be disposed on the first to third emission layers 531, 532, and 533 and the hole transport layer 520. The electron transport layer 540 may be commonly formed over the first to third pixels PX1, PX2, and PX3. The electron transport layer 540 may be located over an entire upper surface of the substrate 100.

The electron transport layer 540 may transfer electrons from the common electrode 600 to the first to third emission layers 531, 532, and 533. Further, the electron transport layer 540 may prevent or reduce instances of holes injected from the first to third pixel electrodes 201, 202, and 203 from moving to the common electrode 600 via the first to third emission layers 531, 532, and 533. That is, the electron transport layer 540 may serve as a hole blocking layer, and may help combination of the holes and electrons in the first to third emission layers 531, 532, and 533.

The electron transport layer 540 may include, e.g., at least one of tris(8-hydroxyquinolinato)aluminum (Alq3), 1,3,5-Tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), beryllium bis (benzoquinolin-10-olate) (Bebq2), 9,10-di(naphthalene-2-yl)anthracene (ADN), and a mixture.

The OLED device may further include an electron injection layer (not shown) disposed on the electron transport layer 540. The electron injection layer may serve to improve the injection of electrons from common electrode 600 to the electron transport layer 540. When the OLED device includes the electron transport layer 540 and the electron injection layer, the electron transport layer 540 may be formed of a lanthanide metal such as at least one of LiF, LiQ, $Li_2O$, BaO, NaCl, CsF, and Yb, or a halogenated metal such as RbCl and/or RbI. Further, the electron injection layer may be formed of a material in which an electron transfer material is mixed with an insulating organic metal salt. The organic metal salt may have an energy band gap of about 4 eV or more. For example, the organic metal salt may include a metal acetate, a metal benzoate, a metal acetoacetate, a metal acetylacetonate, or a metal stearate.

The electron transport layer 540 may be formed along profiles of the first to third emission layers 531, 532, and 533 and the hole transport layer 520 disposed on the pixel defining layer 300. The electron transport layer 540 may be formed along a profile of the upper surface of the pixel defining layer 300. The electron transport layer 540 may be formed along a profile of the uneven structure 310 formed at the upper surface of the pixel defining layer 300 between the first pixel area PXA1 and the second pixel area PXA2. Further, the electron transport layer 540 may be formed along a profile of the substantially flat (or planarized) upper surface of the pixel defining layer 300 between the first pixel area PXA1 and the third pixel area PXA3. Since the electron transport layer 540 is formed between the first pixel area PXA1 and the second pixel area PXA2 along a profile of the upper surface of the pixel defining layer 300 at which the uneven structure 310 is formed, a length of the electron transport layer 540 between the first pixel area PXA1 and the second pixel area PXA2 may increase.

The common electrode 600 may be disposed on the electron transport layer 540. The common electrode 600 may be commonly formed over the first to third pixels PX1, PX2, and PX3. The common electrode 600 may be located over an entire upper surface of the substrate 100. The common electrode 600 may include at least one of a reflective conductive material, a transparent conductive material, and a semi-transparent conductive material.

When the OLED device is a bottom emission type in which an image may be displayed toward the substrate 100, each of the first to third pixel electrodes 201, 202, and 203 may be a transparent electrode, and the common electrode 600 may be a reflective electrode. The first to third pixel electrodes 201, 202, and 203 may be formed of at least one of ITO, IZO, ZnO, and $In_2O_3$ having a high work function, and the common electrode 600 may be formed of a metal having a low work function such as at least one of Ag, Mg, Al, Pt, Au, Ni, Nd, Ir, Cr, Li, and Ca.

When the OLED device is a top emission type in which an image may be displayed toward the common electrode 600, each of the first to third pixel electrodes 201, 202, and 203 may be a reflective electrode, and the common electrode 600 may be a transparent electrode. The first to third pixel electrodes 201, 202, and 203 may include a reflective layer including at least one of Ag, Mg, Al, Pt, Au, Ni, Nd, Ir, Cr, Li, Ca, and a mixture and may include a transmitting layer including at least one of ITO, IZO, ZnO, and $In_2O_3$ having a high work function. Further, the common electrode 600 may be a thin film including a metal having a low work function such as at least one of Ag, Mg, Al, Pt, Au, Ni, Nd, Ir, Cr, Li, Ca, and a mixture.

Figure 4:
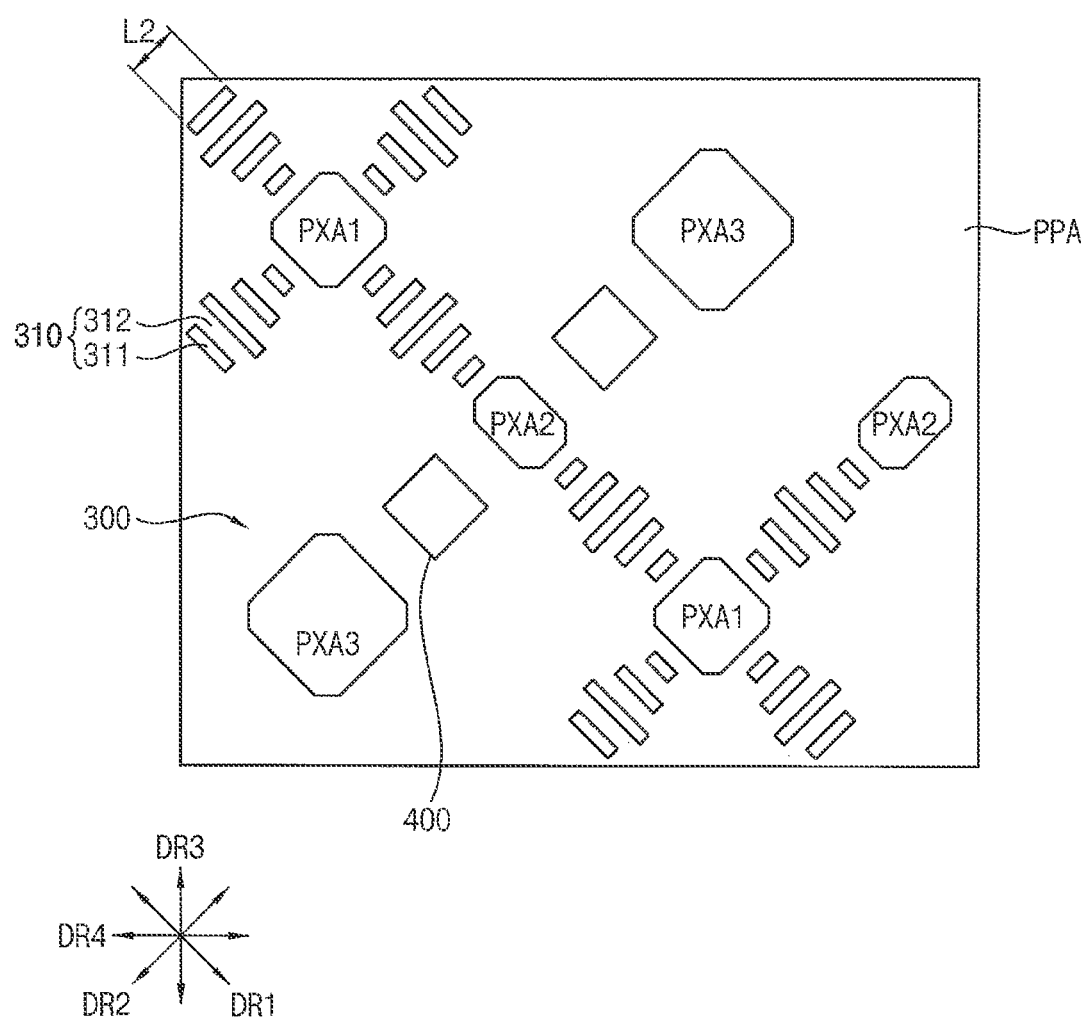
FIG. 4 is a plan view illustrating an OLED device according to an embodiment.

FIG. 4 is a plan view illustrating an organic light emitting display device according to an embodiment.

The OLED device described with reference to the FIG. 4 may be substantially the same as or similar to the OLED device described with reference to FIGS. 1 to 3 except shapes and dimensions of the uneven structure. Accordingly, descriptions on above-described elements may not be repeated.

Referring to FIG. 4, lengths L2 of the concave portions 311 of the uneven structure 310 formed at the upper surface of the pixel defining layer 300 may increase as being away from the first pixel area PXA1 or the second pixel area PXA2. For example, a length L2 of a concave portion 311 may be a length in a lengthwise direction of the concave portion 311. For example, the lengths L2 of the concave portions 311 may sequentially increase along the first direction DR1 or the second direction DR2 from the first pixel area PXA1 to the midpoint between the first pixel area PXA1 and the second pixel area PXA2, and may sequentially decrease along the first direction DR1 or the second direction DR2 from the midpoint to the second pixel area PXA2. The lengths L2 of the concave portions 311 may decrease as approaching the first pixel area PXA1 or the second pixel area PXA2, and may increase as being away from the first pixel area PXA1 or the second pixel area PXA2.

When the uneven structure 310 is formed between the first pixel area PXA1 and the second pixel area PXA2, a leakage current path bypassing the uneven structure 310 may be formed between the first pixel area PXA1 and the second area PXA2. However, when the lengths of the concave portions 311 increase as being away from the first pixel area PXA1 or the second pixel area PXA2, an electrical length of the leakage current path bypassing the uneven structure 310 may increase, therefore, the magnitude of the lateral leakage current between the first pixel PX1 and the second pixel PX2 may decrease or the generation of the lateral leakage current may be substantially prevented.

Figure 5:
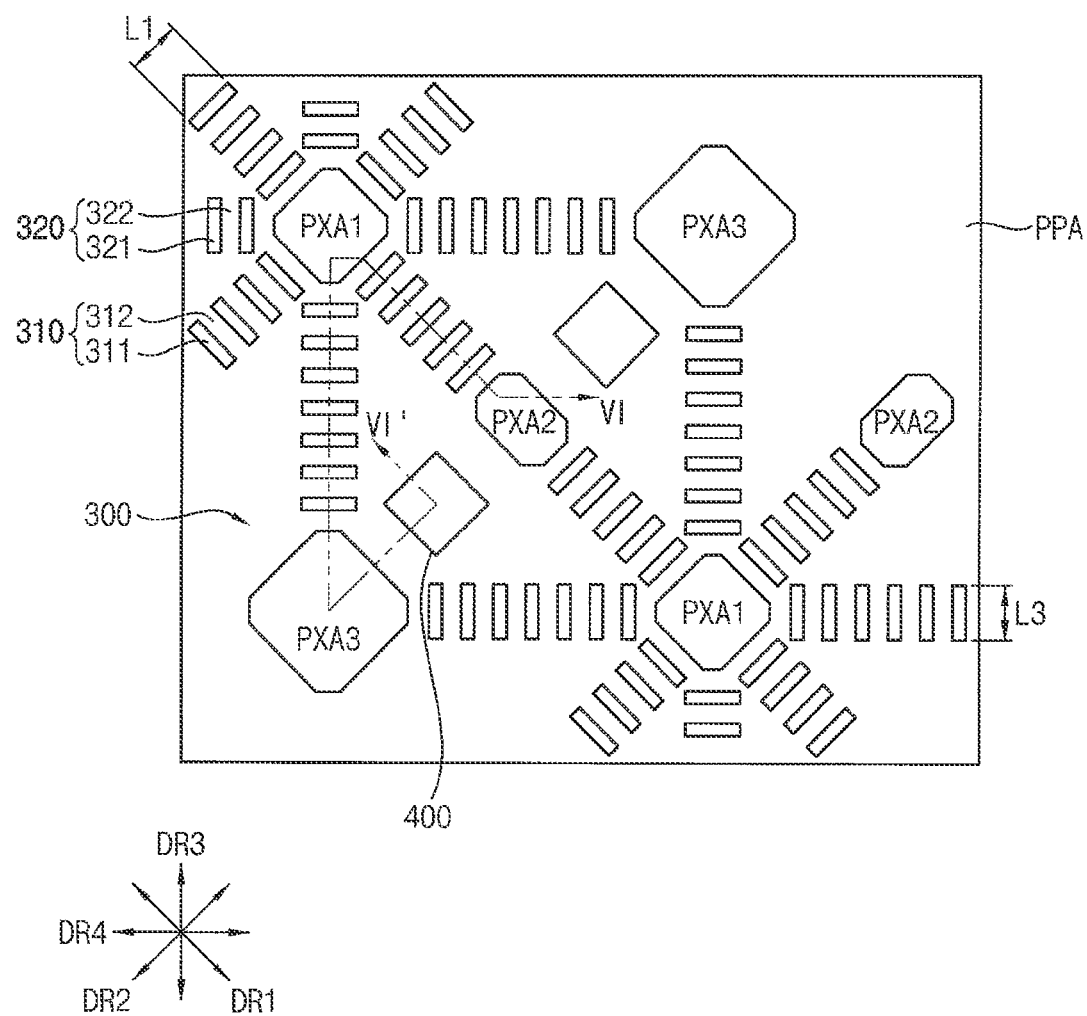
FIG. 5 is a plan view illustrating an OLED device according to an embodiment.
Figure 6:
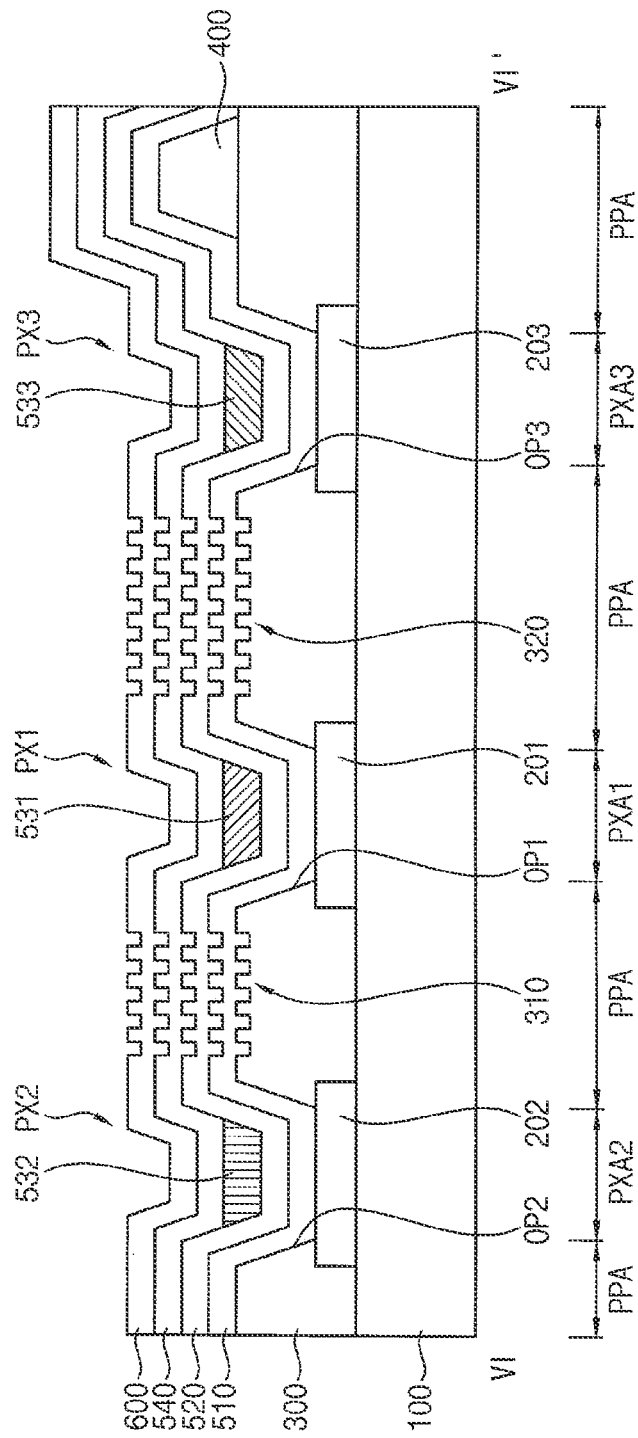
FIG. 6 is a cross-sectional view taken along a line VI-VI' in FIG. 5 according to an embodiment.

FIG. 5 is a plan view illustrating an organic light emitting display device according to an embodiment. FIG. 6 is a cross-sectional view taken along a line VI-VI' in FIG. 5 according to an embodiment.

The OLED device described with reference to the FIGS. 5 and 6 may be substantially the same as or similar to the OLED device described with reference to FIGS. 1 to 3 except locations in which uneven structures are formed. Accordingly, descriptions on above-described elements may not be repeated.

Referring to FIGS. 5 and 6, the uneven structures 310 and 320 formed at the upper surface of the pixel defining layer 300 may be formed between the first pixel area PXA1 and the third pixel area PXA3 in addition to between the first pixel area PXA1 and the second pixel area PXA2. The uneven structures 310 and 320 may include a first uneven structure 310 formed between the first pixel area PXA1 and the second pixel area PXA2 and may include a second uneven structure 320 formed between the first pixel area PXA1 and the third pixel area PXA3. An upper surface of the pixel defining layer 300 at which no uneven structures 310 and 320 are formed may be substantially flat (or planarized).

The second uneven structure 320 may include a plurality of concave portions 321 and a plurality of convex portions 322. The concave portions 321 and the convex portions 322 may be alternatively arranged along the third direction DR3 or the fourth direction DR4 in which the third pixel area PXA3 is spaced from the first pixel area PXA1.

The concave portions 321 may extend along a direction perpendicular to a direction along which the concave portions 321 and the convex portions 322 are alternatively arranged, perpendicular to nearest edges of openings of the pixel defining layer 300, and parallel to the substrate 100. For example, when the concave portions 321 and the convex portions 322 are alternatively arranged along the third direction DR3, each of the concave portions 321 may extend in the fourth direction DR4. Further, when the concave portions 321 and the convex portions 322 are alternatively arranged along the fourth direction DR4, each of the concave portions 321 may extend in the third direction DR3.

In an embodiment, lengths L3 of the concave portions 321 may be substantially equal. For example, a length L3 of a concave portion 321 may be a length in a length direction of the concave portion 321. The concave portions 321 may have substantially the same lengths L3.

In another embodiment, lengths L3 of the concave portions 321 may increase as being away from the first pixel area PXA1 or the third pixel area PXA3. For example, the lengths L3 of the concave portions 321 may sequentially increase along the third direction DR3 or the fourth direction DR4 from the first pixel area PXA1 to the middle between the first pixel area PXA1 and the third pixel area PXA3, and may sequentially decrease along the third direction DR3 or the fourth direction DR4 from the middle to the third pixel area PXA3. The lengths L3 of the concave portions 321 may decrease as approaching the first pixel area PXA1 or the third pixel area PXA3, and may increase as being away from the first pixel area PXA1 or the third pixel area PXA3.

The hole injection layer 510 may be formed along profiles of the first to third pixel electrodes 201, 202, and 203 and the pixel defining layer 300. The hole injection layer 510 may be formed along a profile of the upper surface of the pixel defining layer 300. The hole injection layer 510 may be formed along a profile of the first uneven structure 310 formed at the upper surface of the pixel defining layer 300 between the first pixel area PXA1 and the second pixel area PXA2. Further, the hole injection layer 510 may be formed along a profile of the second uneven structure 320 formed at the upper surface of the pixel defining layer 300 between the first pixel area PXA1 and the third pixel area PXA3. Since the hole injection layer 510 is formed between the first pixel area PXA1 and the third pixel area PXA3 along a profile of the upper surface of the pixel defining layer 300 at which the second uneven structure 320 is formed, an electrical path length of the hole injection layer 510 between the first pixel area PXA1 and the third pixel area PXA3 may increase.

The hole transport layer 520 and the electron transport layer 540 may be formed along a profile of the upper surface of the pixel defining layer 300. The hole transport layer 520 and the electron transport layer 540 may be formed along a profile of the second uneven structure 320 formed at the upper surface of the pixel defining layer 300 between the first pixel area PXA1 and the third pixel area PXA3. Since the hole transport layer 520 and the electron transport layer 540 are formed between the first pixel area PXA1 and the third pixel area PXA3 along a profile of the upper surface of the pixel defining layer 300 at which the second uneven structure 320 is formed, an electrical path length of the hole transport layer 520 and an electrical path length of the electron transport layer 540 between the first pixel area PXA1 and the third pixel area PXA3 may increase.

The first pixel PX1 emitting red light may have a relatively low turn-on voltage. When a distance between the first pixel area PXA1 and the third pixel area PXA3 is relatively short, according to driving of the third pixel PX3, the first pixel PX1 may emit light in response to lateral leakage current transmitted from the third pixel PX3 to the first pixel PX1 via the hole injection layer 510, and color-mixing may occur at low luminance. According to an embodiment, the hole injection layer 510 may be formed along the upper surface of the pixel defining layer 300 at which the uneven structure 320 is formed between the first pixel area PXA1 and the third pixel area PXA3, so that the electrical path length of the hole injection layer 510 between the first pixel area PXA1 and the third pixel area PXA3 may increase; therefore, the electrical resistance of the hole injection layer 510 between the first pixel area PXA1 and the third pixel area PXA3 may increase. Accordingly, the magnitude of the lateral leakage current between the first pixel PX1 and the third pixel PX3 via the hole injection layer 510 may decrease, and color-mixing at low luminance due to the lateral leakage current may be prevented.

FIGS. 7, 8, 9, 10, 11, and 2 are cross-sectional views illustrating structures formed in a method of manufacturing an organic light emitting display device according to an embodiment. A method of manufacturing the OLED device described with reference to FIGS. 1 to 3 is described with reference to FIGS. 7 through 11. The method of manufacturing the OLED device described with reference to FIGS. 7 through 11 may also apply to the OLED device described with reference to FIG. 4 and the OLED device described with reference to FIGS. 5 and 6.

Figure 7:
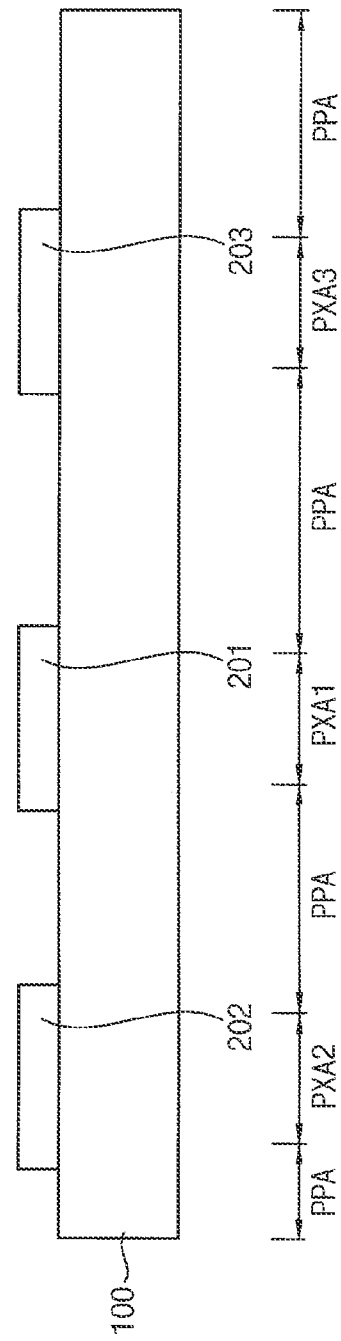
FIGS. 7, 8, 9, 10, and 11 are cross-sectional views illustrating structures formed in a method of manufacturing an OLED device according to an embodiment.

Referring to FIG. 7, a conductive material may be deposited on the substrate 100, and may be patterned to form the first to third pixel electrodes 201, 202, and 203.

Figure 8:
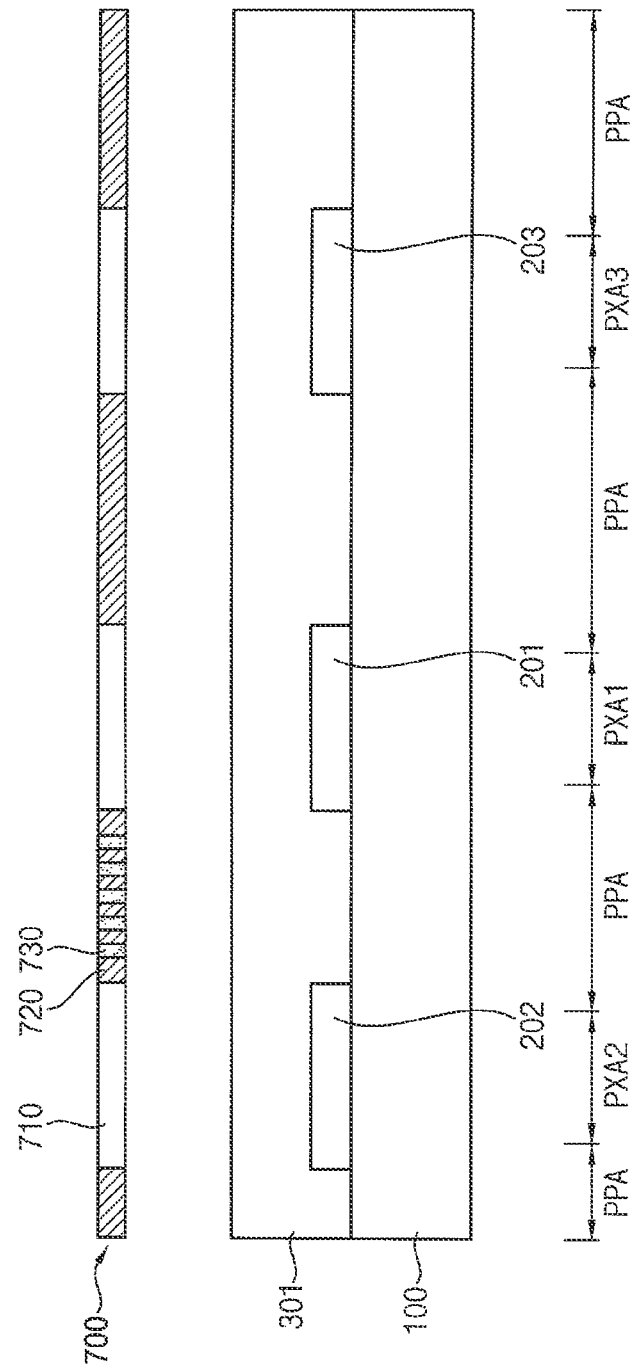

Referring to FIG. 8, a photosensitive organic material may be deposited on the substrate 100 and on the first to third pixel electrodes 201, 202, and 203 to form a preliminary pixel defining layer 301. In an embodiment, the preliminary pixel defining layer 301 may include a positive photosensitive organic material in which a portion exposed to light is removed. In another embodiment, the preliminary pixel defining layer 301 may include a negative photosensitive organic material in which a portion exposed to light is hardened.

A halftone mask 700 may be disposed over the preliminary pixel defining layer 301, and the preliminary pixel defining layer 301 may be exposed using the halftone mask 700. The halftone mask 700 may include a light transmitting portion 710 (or transparent portion 710), a light shielding portion 720, and a semi-light transmitting portion 730 (or translucent portion 730 or semitransparent portion 730). The light transmitting portion 710 may transmit light, the light shielding portion 720 may block light, and the semi-light transmitting portion 730 may transmit a part of light. A light transmittance of the semi-light transmitting portion 730 may be less than a light transmittance of the light transmitting portion 710 and greater than a light transmittance of the light shielding portion 720.

Figure 9:
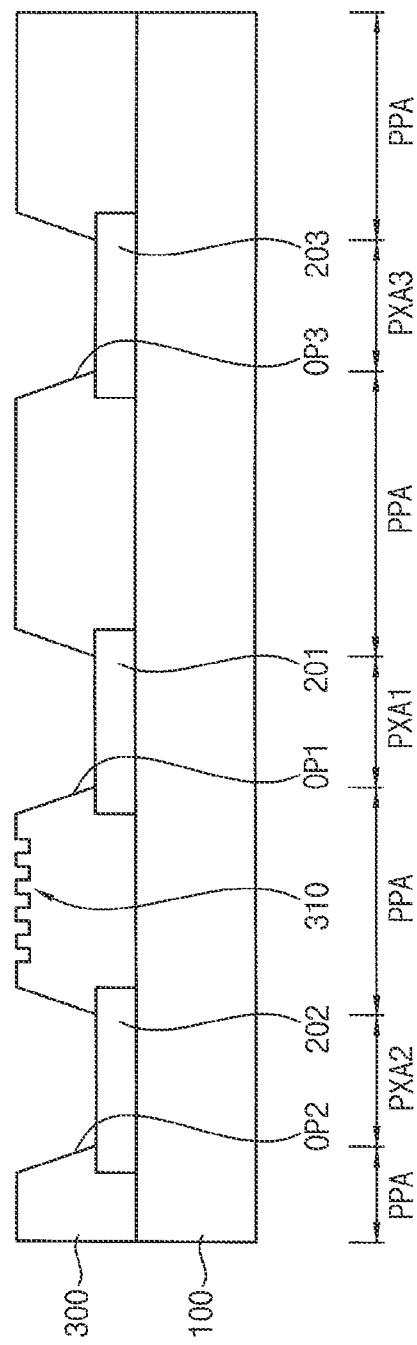

Referring to FIG. 9, the pixel defining layer 300 may be formed on the substrate 100 and may partially expose the first to third pixel electrodes 201, 202, and 203.

The preliminary pixel defining layer 301 irradiated with light through the halftone mask 700 may be developed to form the pixel defining layer 300. A portion of the preliminary pixel defining layer 301 corresponding to the light transmitting portion 710 may be substantially entirely removed, and a portion of the preliminary pixel defining layer 301 corresponding to the light shielding portion 720 may substantially remain. A portion of the preliminary pixel defining layer 301 corresponding to the semi-light transmitting portion 730 may be partially removed. Accordingly, the pixel defining layer 300 may include the first to third opening portions OP1, OP2, and OP3 corresponding to light transmitting portion 710 and respectively exposing the first to third pixel electrodes 201, 202, and 203, may include portions corresponding to the light shielding portion 720 and having a first thickness, and may include portions corresponding to the semi-light transmitting portion 730 and having a second thickness less than the first thickness. Portions in the pixel defining layer 300 having the first thickness may correspond to convex portions of the uneven structure 310 and the substantially flat (or planarized) upper surface, and portions in the pixel defining layer 300 having the second thickness may correspond to concave portions of the uneven structure 310.

The pixel defining layer 300 may be formed using the halftone mask 700, so that the opening portions OP1, OP2, and OP3 and the upper surface at which the uneven structure 310 may be formed by single photolithography process. Therefore, manufacturing time and cost of the OLED device may be minimized.

Figure 10:
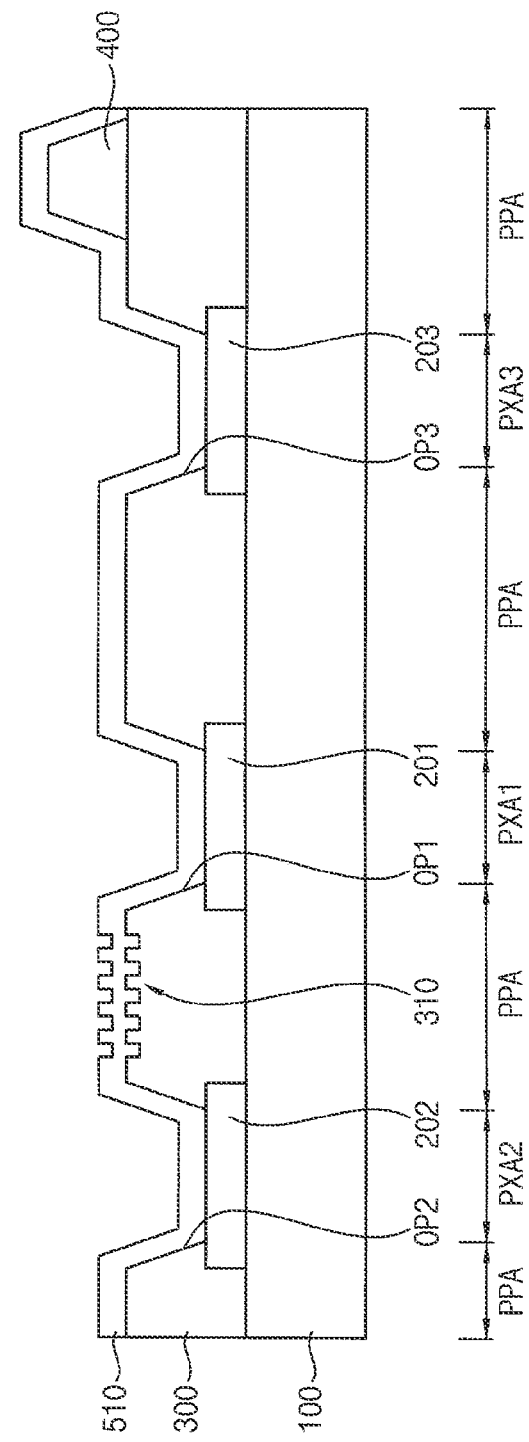

Referring to FIG. 10, a photosensitive organic material may be deposited on the pixel defining layer 300, and may be patterned to form the spacer 400. Then, a hole injecting material may be deposited on the pixel defining layer 300 and on the spacer 400 to form the hole injection layer 510. The hole injection layer 510 may be formed using at least one of various methods such as vacuum deposition, spin coating, casting, Langmuir-Blodgett (LB) deposition, ink-jet printing, laser-printing, and laser-induced thermal imaging. The hole injection layer 510 may be formed along profiles of the first to third pixel electrodes 201, 202, and 203 and the pixel defining layer 300. The hole injection layer 510 may be formed along a profile of the uneven structure 310 formed at the upper surface of the pixel defining layer 300.

Figure 11:
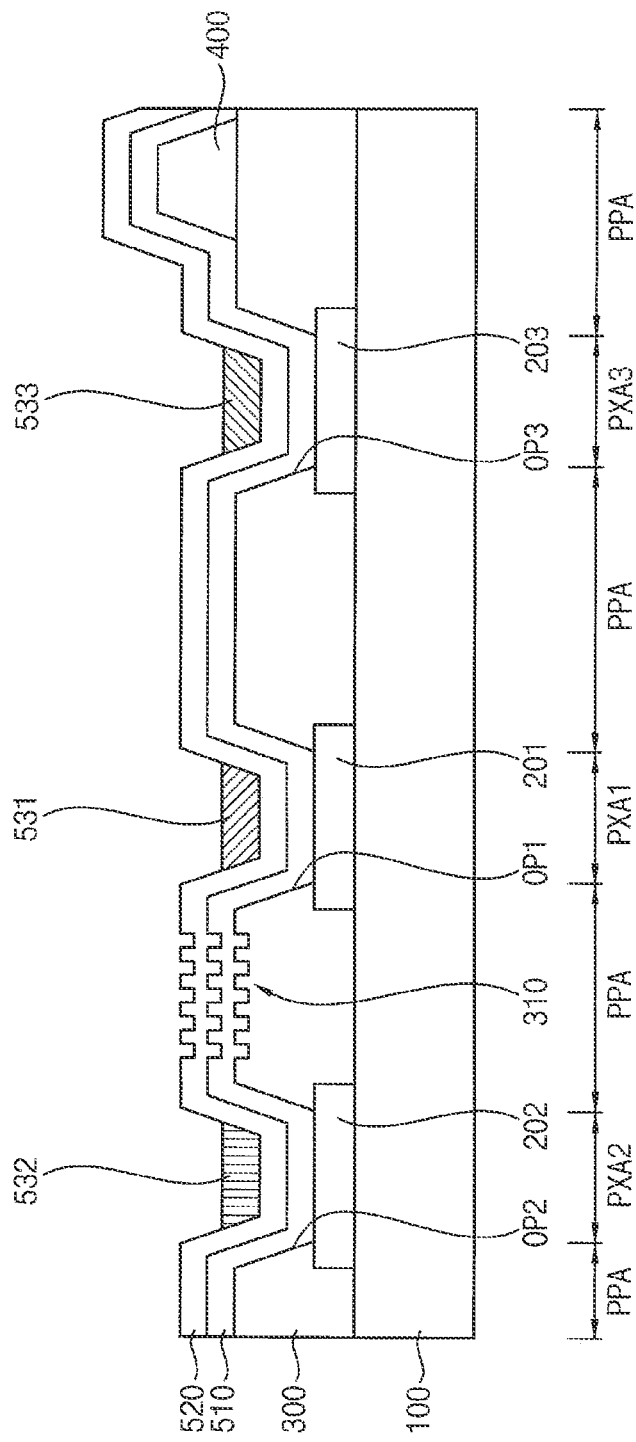

Referring to FIG. 11, a hole transporting material may be deposited on the hole injection layer 510 to form the hole transport layer 520. The hole transport layer 520 may be formed along a profile of the hole injection layer 510. The hole transport layer 520 may be formed along a profile of the uneven structure 310 formed at the upper surface of the pixel defining layer 300. Then, an organic light emitting material may be injected on the hole transport layer 520 to form the first to third emission layers 531, 532, and 533. The hole transport layer 520 and the first to third emission layers 531, 532, and 533 may be formed using at least one of various methods such as vacuum deposition, spin coating, casting, Langmuir-Blodgett (LB) deposition, ink-jet printing, laser-printing, and laser-induced thermal imaging.

Referring to FIG. 2, an electron transporting material may be deposited on the hole transport layer 520 and on the first to third emission layers 531, 532, and 533 to form the electron transport layer 540. The electron transport layer 540 may be formed using at least one of various methods such as vacuum deposition, spin coating, casting, Langmuir-Blodgett (LB) deposition, ink-jet printing, laser-printing, and laser-induced thermal imaging. When the OLED device includes an electron injection layer, an electron injecting material may be deposited on the electron transport layer 540 to form the electron injection layer. Then, a conductive material may be deposited on the electron transport layer 540 to form the common electrode 600. The electron transport layer 540 and the common electrode 600 may be formed along profiles of the first to third emission layers 531, 532, and 533 and the hole transport layer 520. The electron transport layer 540 and the common electrode 600 may be formed along a profile of the uneven structure 310 formed at the upper surface of the pixel defining layer 300.

An organic light emitting display device according to an embodiment may be applied to a display device included in a computer, a notebook, a mobile phone, a smartphone, a smart pad, a PMP, a PDA, an MP3 player, or the like.

Although example embodiments have been described with reference to the drawings, the example embodiments may be modified without departing from the scope defined in the following claims.

What is claimed is:

1. A method of manufacturing an OLED device, the method comprising:
    forming a first pixel electrode, a second pixel electrode, and a third pixel electrode on a substrate;
    forming a pixel defining layer on a face of the substrate, wherein the pixel defining layer comprises a first opening, a second opening, and a third opening respectively partially exposing the first pixel electrode, the second pixel electrode, and the third pixel electrode, wherein the pixel defining layer further comprises an uneven surface and a first flat face, wherein the uneven surface is opposite the first flat face, includes flat faces, and is positioned between the first opening and the second opening, wherein the flat faces are spaced from one another and are parallel to the face of the substrate, wherein the first flat face is positioned between the first pixel electrode and the second pixel electrode and is positioned between the uneven surface and the substrate, and wherein the uneven surface is disposed between the first pixel electrode and the second pixel electrode, and is disposed between the first pixel electrode and the third pixel electrode;
    forming a spacer disposed in the pixel defining layer, wherein the spacer is disposed between the second pixel electrode and the third pixel electrode;
    forming a first emission layer, a second emission layer, and a third emission layer that respectively correspond to the first opening, the second opening, and the third opening; and
    forming a common electrode that overlaps each of the first emission layer, the second emission layer, and the third emission layer.

2. The method of claim 1, wherein the uneven surface includes cavities and protrusions alternatively arranged between the first opening and the second opening.

3. The method of claim 2, wherein forming the pixel defining layer includes:
    forming a material layer on the substrate, the first pixel electrode, the second pixel electrode, and the third pixel electrode;
    providing a halftone mask over the material layer; and
    exposing and developing the material layer using the halftone mask.

4. The method of claim 3, wherein the halftone mask includes light transmitting portions, light shielding portions, and semi-light transmitting portions,
    wherein the light transmitting portions correspond to the first opening, the second opening, and the third opening,
    wherein the light shielding portions correspond to the protrusions of the uneven surface structure, and
    wherein the semi-light transmitting portions correspond to the cavities of the uneven surface structure.

* * * * *